(12) United States Patent
Iwamoto

(10) Patent No.: US 6,898,831 B2
(45) Date of Patent: May 31, 2005

(54) METHOD OF PRODUCING A SURFACE ACOUSTIC WAVE DEVICE

(75) Inventor: Takashi Iwamoto, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 442 days.

(21) Appl. No.: 10/235,566

(22) Filed: Sep. 6, 2002

(65) Prior Publication Data

US 2003/0011278 A1 Jan. 16, 2003

Related U.S. Application Data

(62) Division of application No. 09/907,200, filed on Jul. 17, 2001, now Pat. No. 6,545,388.

(30) Foreign Application Priority Data

Jul. 31, 2000 (JP) ........................................ 2000-231183

(51) Int. Cl.[7] ........................... H04R 17/00; H01L 4/04; H01L 4/08; H01L 4/18
(52) U.S. Cl. ........................... 29/25.35; 29/594; 29/412; 29/417; 29/831; 310/313 D
(58) Field of Search ............................... 29/25.35, 594, 29/412, 417, 831; 977/DIG. 1; 310/313 A, 313 B, 313 C, 313 D, 364

(56) References Cited

U.S. PATENT DOCUMENTS

| | | | | |
|---|---|---|---|---|
| 4,064,621 A | * | 12/1977 | Lo | 438/26 |
| 4,098,921 A | * | 7/1978 | Calviello | 438/694 |
| 5,373,175 A | * | 12/1994 | Ozawa et al. | 257/99 |
| 5,760,423 A | * | 6/1998 | Kamakura et al. | 257/99 |
| 5,929,723 A | * | 7/1999 | Kimura et al. | 333/193 |
| 5,996,199 A | * | 12/1999 | Ichikawa et al. | 29/25.35 |

FOREIGN PATENT DOCUMENTS

| | | |
|---|---|---|
| JP | 60-90413 | 5/1985 |
| JP | 5-267981 | 10/1993 |
| JP | 8-250966 | 9/1996 |
| JP | 10-247835 | 9/1998 |
| JP | 11-74751 | 3/1999 |
| JP | 2000-138551 | 5/2000 |

* cited by examiner

Primary Examiner—A. Dexter Tugbang
Assistant Examiner—Tai Nguyen
(74) Attorney, Agent, or Firm—Keating & Bennett, LLP

(57) ABSTRACT

A surface acoustic wave device includes interdigital transducer (IDT) electrode and reflectors disposed on a piezoelectric substrate. Each of the IDT electrode and the reflectors has a multi-layer film structure including at least one layer (high specific gravity metal component containing layer) including as a major component a metal with a specific gravity of at least about 15 and having a film-thickness of at least about 10 nm, and at least one layer (low specific gravity metal component containing layer) including as a major component a metal with a specific gravity of up to about 10 and a volume resistivity as a bulk value (at about 20° C.) of up to about $10 \times 10^{-8}$ Ω·m, and having a film-thickness of at least about 10 nm. For example, the multi-layer structure includes an Ni film (low specific gravity metal component containing layer) with a film-thickness of about 150 nm disposed on a Ti film, a Cu film (low specific gravity metal component containing layer) with a film-thickness of about 250 nm disposed on the Ni film, and an Au film (high specific gravity metal component containing layer) with a film-thickness of about 50 nm disposed on the Cu film.

3 Claims, 2 Drawing Sheets

METHOD OF PRODUCING A SURFACE ACOUSTIC WAVE DEVICE

This application is a Divisional of U.S. patent application Ser. No. 09/907,200 filed Jul. 17, 2001, now U.S. Pat. No. 6,545,388.

BACKGROUND OF THE INVENTION

1. Field of the Invention

The present invention relates to a surface acoustic wave device for use in, for example, a band-pass filter or a resonator, and the present invention also relates to a method of producing such a surface acoustic wave device.

2. Description of the Related Art

Conventionally, surface acoustic wave devices have been widely used as band-pass filters and resonators. For application of surface acoustic wave devices as band-pass filters, resonators, or other such devices, the most important requirement is that the devices must have good frequency characteristics.

Generally, appropriate materials (electrode materials) for constructing the interdigital transducers ("IDTs") and reflectors of the surface acoustic wave devices are different from each other, depending on the surface acoustic wave mode to be used and the particular application for the device. For example, as appropriate materials for the IDTs and reflectors of resonators and band-pass filters using Shear Horizontal or SH waves, metals such as Au, W, Ta, and Pt, having a specific gravity of 15 or higher are used in many cases.

Moreover, in the resonators, the band-pass filters, and such devices, in order to suppress vibration modes that deteriorate the characteristics thereof, the thicknesses of the IDT electrodes and reflectors must be within a predetermined range in some cases. If the film thicknesses of the IDT electrodes and the reflectors have predetermined values so that the vibration modes that deteriorate the characteristics can be initially suppressed, the film thicknesses will significantly depart from the values at which the surface acoustic waves can be most effectively vibrated and reflected. Thus, in some cases, a problem arises in that the necessary good characteristic cannot be obtained.

Moreover, if the film-thicknesses of the IDT electrodes and the reflectors are restricted, it will be more difficult to sufficiently reduce the resistances of the IDT electrodes, and also, problematically, the devices cannot be sufficiently adapted for operation at a high frequency.

Referring to production of multiple filters and resonators using the same wafer, it is desirable that the frequency dispersion be made as small as possible. For this purpose, advantageously, materials having a specific gravity of up to 10, such as Ni, Cu, Al, Mg, and Co, are used. However, when these materials are used, it is difficult to obtain filters and resonators having desired characteristics in practice.

Moreover, when filters and resonators including IDT electrodes and reflectors using metals with a specific gravity of 15 or higher, such as Au, W, Ta, and Pt, are produced, efforts are made to form the IDT electrode and reflector films as uniformly as possible so that the frequency dispersion of multiple surface acoustic wave devices (filters, resonators, and other such devices) produced by using the same wafer can be suppressed. However, there is a limit to the reduction in thickness of the IDT electrodes and the reflectors. Practically, the wafer is divided in individual elements, and thereafter, frequency-adjustment is carried out for each of the elements. The frequency-adjustment is made because a slight difference in film thickness between the electrode films constituting the IDT electrodes and the reflectors causes the acoustic velocity to change significantly, thereby increasing the frequency dispersion of the resonators and filters.

In order to achieve the frequency-adjustment, a method of etching the surface of an IDT electrode by using ion beams, a method of forming an insulator film on a substrate and an IDT electrode, a method of etching a substrate or an IDT electrode by RIE, are generally used. Accordingly, a problem arises in that the manufacturing cost is increased due to reduction of throughput, and moreover, the characteristics deteriorate due to damage to the electrodes and the substrates.

SUMMARY OF THE INVENTION

In order to overcome the problems described above, preferred embodiments of the present invention provide a surface acoustic wave device in which frequency dispersion, influenced by dispersion in film-thickness, is minimized, while suitable excellent resonance characteristics and filter characteristics are ensured. In addition, preferred embodiments of the present invention provide a method of producing such a surface acoustic wave device.

According to a preferred embodiment of the present invention, a surface acoustic wave device includes an interdigital transducer (IDT) electrode, or an IDT electrode and a reflector, disposed on a piezoelectric substrate, each of the IDT electrode and the reflector having a multi-layer film structure including: (a) at least one high specific gravity metal component containing a layer having a film-thickness of at least about 10 nm and including as a major component a metal having a specific gravity of at least about 15; and (b) at least one low specific gravity metal component containing a layer having a film-thickness of at least about 10 nm and including as a major component a metal having a specific gravity of up to about 10 and a bulk resistivity, at 20° C., of up to about $10 \times 10^{-8}$ $\Omega \cdot m$.

By forming an interdigital transducer (IDT) electrode, or the IDT electrode and a reflector on a piezoelectric substrate, each of the IDT electrode and the reflector having a multi-layer film structure including at least one layer containing, as a major component, a metal with a specific gravity of at least about 15 and a film-thickness of at least about 10 nm as a high specific gravity metal component containing layer, and at least one layer including as a major component a metal with a specific gravity of up to about 10 and a bulk resistivity, at 20° C., of up to about $10 \times 10^{-8}$ $\Omega \cdot m$, and a film-thickness of at least about 10 nm as a low specific gravity metal component containing layer, excellent resonator and filter characteristics can be ensured, and also, frequency dispersion, which may be caused by dispersions in film-thickness, is minimized. Thus, it is unnecessary to perform frequency adjustment, and the manufacturing cost is greatly reduced due to the increased throughput. In addition, damage to the substrate, the IDT electrode, and the reflector is prevented, which further enhances the yield.

In particular, since the high specific gravity metal component containing layer is provided, an SH wave can be easily excited and reflected. Moreover, since the low specific gravity metal component containing layer is provided, frequency dispersion, which may occur when a plurality of filters and resonators are produced using the same wafer, is minimized. Thus, surface acoustic wave devices having excellent resonance and filter characteristics is obtained.

In addition, a vibration mode that exerts an undesirable influence over the characteristics is minimized in the film-thickness range in which high excitation and reflection efficiencies can be ensured.

Preferably, the total number of the at least one high specific gravity metal component containing layer and the at least one low specific gravity metal component containing layer which are included in the IDT electrode or the reflector is preferably in the range of from 2 to 10.

By setting the total number of the at least one high specific gravity metal component containing layer and the at least one low specific gravity metal component containing layer to be in the range of from 2 to 10, the surface acoustic wave device having excellent resonance and filter characteristics can be obtained without having to perform excessively complicated lamination processes. Thus, the present invention is highly effective and advantageous.

Also, preferably, the metal having a specific gravity of at least about 15 that constitutes the high specific gravity metal component containing layer is preferably selected from the group consisting of Au, W, Ta, Pt, and alloys containing at least one of the metals, and the metal having a specific gravity of up to about 10 and a bulk resistivity, at 20° C., of up to about $10 \times 10^{-8}$ $\Omega \cdot m$ of the low specific gravity metal component containing layer is preferably selected from the group consisting of Ni, Cu, Al, Mg, Co, Fe, Zn, and alloys containing at least one of the metals. Other suitable materials may also be used for the high specific gravity metal component containing layer and the low specific gravity metal component containing layer.

By using, as the metal having a specific gravity of at least about 15 that constitutes the high specific gravity metal component containing layer, a metal selected from the group consisting of Au, W, Ta, Pt, and alloys containing at least one of the metals, and as the metal having a specific gravity of up to about 10 and a bulk resistivity, at 20° C., of up to about $10 \times 10^{-8}$ $\Omega \cdot m$ of the low specific gravity metal component containing layer, a metal selected from the group consisting of Ni, Cu, Al, Mg, Co, Fe, Zn, and alloys containing at least one of the metals, the surface acoustic wave has a minimized frequency dispersion and excellent resonance and filter characteristics. Thus, the present invention is highly effective and advantageous.

Also, preferably, the surface acoustic wave device utilizes excitation of an SH wave.

When the present invention is embodied as a surface acoustic wave device utilizing the excitation of an SH wave, the surface acoustic wave device operates such that an SH wave is efficiently excited and reflected, and such that excellent resonance and filter characteristics and minimal frequency dispersion are achieved.

More preferably, the volume of the low specific gravity metal component containing layer that constitutes the IDT electrode or the reflector is in the range of about 25% to about 98% of the overall volume of the IDT electrode or the reflector.

When the volume of the at least one low specific gravity metal component containing layer which constitutes the IDT electrode or the reflector is in the range of about 25% to about 98% of the overall volume of the IDT electrode or the reflector, high resonator and filter characteristics is ensured, frequency dispersion, which may be caused by dispersion in film thickness, is minimized, and also, frequency adjustment for each of the surface acoustic wave devices is made unnecessary. Moreover, the manufacturing cost is greatly reduced due to the increased throughput, and the yield is greatly improved since damage to the substrate, the IDT electrode, and the reflector is prevented.

As described above, preferably, the volume of the low specific gravity metal component containing layer that constitutes the IDT electrode or the reflector is in the range of about 25% to about 98% of the overall volume of the IDT electrode or the reflector. This is because, if the volume is less than about 25% of the overall volume of the IDT electrode or the reflector, dispersion in filter characteristics, caused by dispersion in film-thickness, is increased, and if the volume exceeds about 98%, the surface acoustic wave reflectivity of the reflector becomes undesirable.

Also, preferably, the volume of the low specific gravity metal component containing layer that constitutes the IDT electrode or the reflector is in the range of about 60% to about 98% of the total volume of the IDT electrode or the reflector.

By setting the volume of the low specific gravity metal component containing layer that constitutes the IDT electrode or the optional reflector in the range of about 60% to about 98% of the overall volume of the IDT electrode or the reflector, further improved resonator and filter characteristics is ensured, and frequency dispersion, which may be caused by dispersion in film-thickness, is minimized.

Moreover, preferably, in the IDT electrode or the reflector, the low specific gravity metal component containing layer is located nearer to the piezoelectric substrate than the high specific gravity metal component containing layer.

When the low specific gravity metal component containing layer is located nearer to the piezoelectric substrate than the high specific gravity metal component containing layer in the IDT electrode or the reflector, both of the effects of the reflector on reflection of a surface acoustic wave and the effects on suppression of dispersions in frequency, are achieved.

Furthermore, preferably, the high specific gravity metal component containing layer is arranged as the outermost surface layer of the IDT electrode or the reflector.

By arranged the high specific gravity metal component containing layer as the outermost surface layer of the IDT electrode or the reflector, the frequency adjustment can be efficiently performed simply by irradiating ion beams at a low dose, if the adjustment is required. Thus, deterioration of the characteristics is minimized.

Also preferably, the low specific gravity metal component containing layer contains Ni as a major component, and the high specific gravity metal component containing layer contains Au as a major component.

By using, as the low specific gravity metal component containing layer, a layer containing Ni as a major component and, as the high specific gravity metal component containing layer, a layer containing Au as a major component, the effects of Ni on suppression of influences caused by dispersion in film thickness, and also, the effects of Au on high reflection of a surface acoustic wave can be achieved.

Furthermore, preferably, the low specific gravity metal component containing layer contains Cu as a major component.

By using as the low specific gravity metal component containing layer, a layer containing Cu as a major component, the resistivity of the film is minimized. Thus, excellent filter and resonator characteristics are obtained.

Moreover, preferably, the IDT electrode or the reflector includes the high specific metal component containing layer containing Au as a major component, the low specific gravity metal component containing layer containing Cu as a major component, and the low specific gravity metal component containing layer containing Ni as a major component, and the volume of the high specific metal component containing layer containing Au as a major component is preferably in the range of about 2% to about 30% of the overall volume of the IDT electrode or the reflector, the volume of the low specific metal component containing layer containing Cu as a major component is in the range of about 10% to about 60% of the overall volume of the IDT electrode or the reflector, and the volume of the low specific metal component containing layer containing Ni as a major component is preferably in the range of about 15% to about 78% of the overall volume of the IDT electrode or the reflector.

Since the IDT electrode or the reflector includes the high specific metal component containing layer containing Au as a major component, the low specific gravity metal component containing layer containing Cu as a major component, and the low specific gravity metal component containing layer containing Ni as a major component, and the volume of the high specific metal component containing layer containing Au as a major component is in the range of about 2% to about 30% of the overall volume of the IDT electrode or the reflector, and moreover, the volume of the low specific metal component containing layer containing Cu as a major component is in the range of about 10% to about 60% of the overall volume of the IDT electrode or the reflector, and the volume of the low specific metal component containing layer containing Ni as a major component is in the range of about 15% to about 78% of the overall volume of the IDT electrode or the reflector, undesirable waves, which may be caused when the device is used as for a resonator or a filter, are minimized, and excellent characteristics are obtained.

Also preferably, in the IDT electrode or the reflector, the low specific metal component containing layer containing Cu as a major component is preferably located between the high specific metal component containing layer including Au as a major component and the piezoelectric substrate, and the low specific metal component containing layer including Ni as a major component is preferably located between the low specific metal component containing layer including Cu as a major component and the piezoelectric substrate.

By disposing the low specific metal component containing layer including Cu as a major component between the high specific metal component containing layer including Au as a major component and the piezoelectric substrate, and by disposing the low specific metal component containing layer including Ni as a major component between the low specific metal component containing layer including Cu as a major component and the piezoelectric substrate in the IDT electrode or the reflector, both of the effects on suppression of undesired waves and the effects on reduction of a resonance resistance are achieved.

According to another preferred embodiment of the present invention, a method of manufacturing a surface acoustic wave device includes the steps of forming a plurality of IDT electrodes or a plurality of IDT electrodes and reflectors on a mother wafer substrate of a piezoelectric substrate, the piezoelectric substrate being defined by a rotated Y-cut quartz substrate having Euler's angles expressed as (0, θ, φ) in which θ is in the approximate range of 125°<θ<132° or is equivalent to the range in such a manner that the angle φ of the surface acoustic wave propagation direction with respect to the crystal X axis is about 90°, and cutting the mother wafer at predetermined positions to divide the mother wafer into individual surface acoustic wave elements.

When the surface acoustic wave device is produced by forming the IDT electrode and the reflectors on the mother wafer, and cutting the mother wafer to divide the mother wafer into individual surface acoustic wave devices, the IDT electrodes and the reflectors have the above-described multi-layer structure, and therefore, frequency dispersion, which may be caused by dispersion in the thickness of the electrode films constituting the IDT electrode and the reflector in the individual surface acoustic wave devices, is minimized. Thus, the surface acoustic wave device of which the characteristics have lower dispersion can be efficiently produced. Moreover, frequency adjustment for each of the surface acoustic wave devices becomes unnecessary. Thus, the manufacturing cost is greatly reduced, throughput is greatly increased, and a high yield is obtained while damage to the substrate, the IDT electrode, and the reflector is prevented.

Preferably, the surface acoustic wave device of preferred embodiments of the present invention is produced by the above method, wherein the device is formed by cutting the mother wafer having the plurality of IDT electrodes, or the plurality of IDT electrodes and the plurality of reflectors, so as to divide the mother wafer into individual surface acoustic wave elements.

Since the surface acoustic wave device of various preferred embodiments of the present invention is produced by cutting the mother wafer having the plurality of IDT electrodes or the plurality of IDT electrodes and the plurality of reflectors, and the IDT electrodes and the reflectors have the multi-layer structure, frequency dispersion is minimized and frequency adjustment for each of the surface acoustic wave devices is not needed. Accordingly, a surface acoustic wave device having excellent resonator and filter characteristics and minimal dispersion in characteristics is provided at low cost.

Other features, elements, characteristics and advantages of the present invention will become more apparent from the following detailed description of preferred embodiments with reference to the attached drawings.

DETAILED DESCRIPTION OF PREFERRED EMBODIMENTS

The following preferred embodiments will be described for illustration of the characteristics of the present invention.

Figure 1:
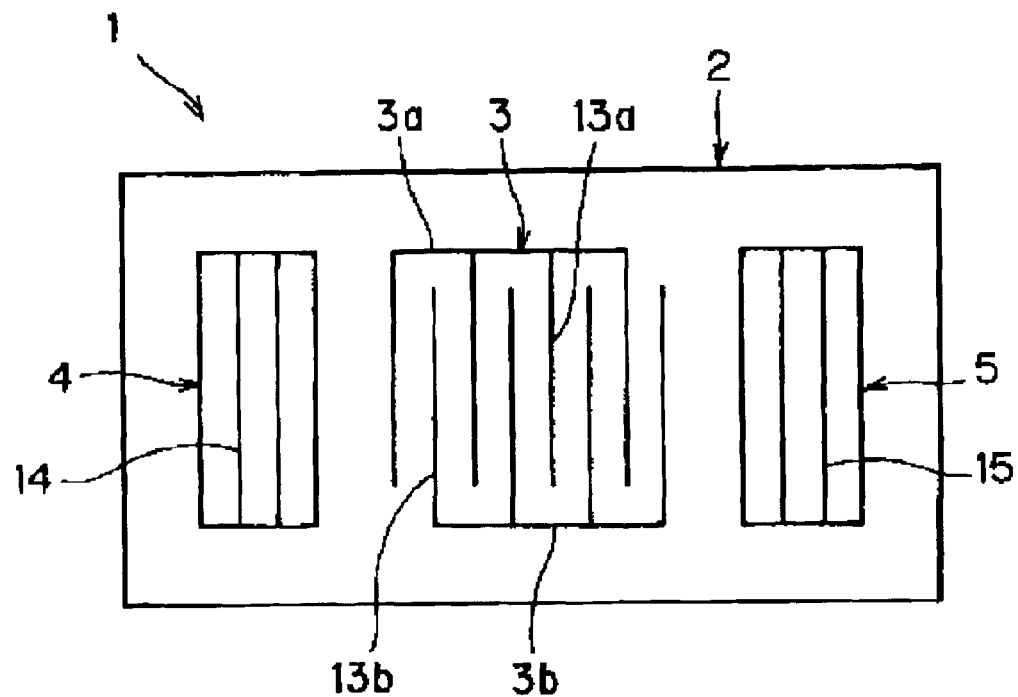
FIG. 1 is a plan view of a surface acoustic wave device according to a preferred embodiment of the present invention.

FIG. 1 is a plan view of a surface acoustic wave device according to a preferred embodiment of the present invention.

A surface acoustic wave device 1 preferably includes an interdigital transducer (IDT) electrode 3, and reflectors 4 and 5 disposed on both of the sides in the surface acoustic wave propagation direction of the IDT electrode 3 on a piezoelectric substrate 2. The surface acoustic wave device 1 is an end surface reflection-type surface acoustic wave resonator which utilizes an SH wave such as a Love wave or other suitable wave as a surface acoustic wave.

The IDT electrode 3 preferably includes one pair of interdigital electrodes 3a and 3b having electrode portions 13a and 13b that are interdigitated with each other. The electrode portions 13a and 13b extend substantially perpendicularly to the surface wave propagation direction. Moreover, the reflectors 4 and 5 are grating type reflectors, and are arranged such that a plurality of electrode portions 14 and 15 are short-circuited at each of the ends thereof.

Figure 2:
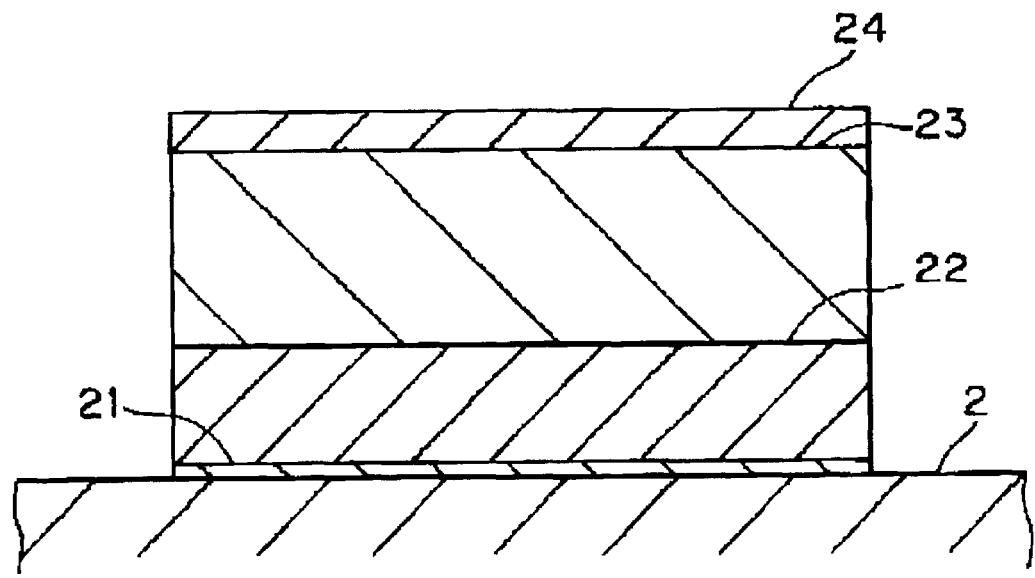
FIG. 2 is a cross-sectional view of the IDT structure of the surface acoustic wave device according to the preferred embodiment of the present invention.

In the surface acoustic wave device of this preferred embodiment, the IDT electrode 3 and the reflectors 4 and 5 preferably have a four-layer structure, as shown in FIG. 2, in which the following are provided:

1) a Ti film 21 with a film-thickness of about 5 nm, disposed on the surface of the piezoelectric substrate 2;

2) an Ni film (low specific gravity metal component containing layer) 22 with a film-thickness of about 150 nm disposed on the Ti film 21;

3) a Cu film (low specific gravity metal component containing layer) 23 with a film-thickness of about 250 nm disposed on the Ni film 22; and 4) an Au film (high specific gravity metal component containing layer) 24 with a film-thickness of about 50 nm disposed on the Cu film 23.

The Ti film 21 is provided to enhance the adhesion between the piezoelectric substrate 2 and the metal electrode layers.

The ratio by volume of the low specific gravity metal component containing layers relative to the entire volume of the IDT electrode 3 or the reflectors 4 and 5 is preferably about 88%.

Moreover, the ratio by volume of the Ni film 22 relative to the entire volume of the IDT electrode 3 or the reflectors 4 and 5 is preferably about 33%. The ratio by volume of the Cu film 23 relative to the entire volume of the IDT electrode 3 or the reflectors 4 and 5 is preferably about 55%. The ratio by volume of the Au film 24 relative to the entire volume of the IDT electrode 3 or the reflectors 4 and 5 is preferably about 11%.

In this preferred embodiment, the low specific gravity metal component containing layers (the Ni film 22 and the Cu film 23) are preferably positioned nearer to the piezoelectric substrate 2 than the high specific gravity metal component containing layer (the Au film 24). The high specific gravity metal component containing layer (the Au film 24) is arranged to define the outermost surface layer.

Moreover, in this preferred embodiment, the Cu film (low specific gravity metal component containing layer) 23 is preferably disposed between the Au film (high specific gravity metal component containing layer) 24 and the piezoelectric substrate 2. The Ni film (low specific gravity metal component containing layer) is disposed between the Cu film and the piezoelectric substrate 2.

In the surface acoustic wave device 1 of this preferred embodiment, an EB evaporation method is preferably used as a film-forming method for formation of the IDT electrode 3 and the reflectors 4 and 5 having a multi-layer structure.

As a patterning method for formation of the IDT electrode 3 and the reflectors 4 and 5 having a multi-layer structure, a lift-off process is preferably used. That is, a photosensitive resin (resist) is preferably formed in a predetermined pattern on the piezoelectric substrate 2 (wafer) by a photolithographic method. Thereafter, the Ti film, the Ni film, the Cu film, and the Au film are formed in that order, and then, the resist is removed with a solvent while simultaneously removing unnecessary portions of the metal films. Thus, the surface acoustic wave device 1 including the IDT electrode 3 and the reflectors 4 and 5 having a multi-layer structure, as shown in FIGS. 1 and 2, are formed.

The surface acoustic wave device 1 is provided with the IDT electrode 3 and the reflectors 4 and 5 each having the multi-layer structure, which includes the Ti film 21 having a film thickness of about 5 nm, for example, on the piezoelectric substrate 2, the Ni film (low specific gravity metal component containing layer) 22 having a film thickness of about 150 nm, for example, formed on the Ti film 21, the Cu film (low specific gravity metal component containing layer) 23 having a film thickness of about 250 nm, for example, formed on the Ni film 22, and the Au film (high specific gravity metal component containing layer) 24 with a film thickness of about 50 nm, for example, formed on the Cu film 23. The surface acoustic wave device 1, including the high specific gravity metal component containing layer, can easily excite and reflect, for example, an SH wave or other such waves. Moreover, in the surface acoustic wave device 1 including the low specific gravity metal component containing layers, frequency dispersion, which may be caused when a plurality of filters and resonators are formed using the same wafer, is minimized. Also, in surface acoustic wave devices utilizing the excitation of an SH wave, such as the surface acoustic wave device 1 of this preferred embodiment, the SH wave can be effectively excited, and excellent resonance and filter characteristics are achieved.

The surface acoustic wave device 1 can be efficiently produced using the method described below. On a mother wafer for the piezoelectric substrate, which is preferably made of a crystal Y-rotation plate having Euler's angles expressed as (0, θ, φ) in which θ is in the approximate range of 125°<θ<132° or is equivalent to the range, IDT electrodes, or IDT electrodes and reflectors each having the above-described multi-layer structure are arranged such that the angle θ of the surface acoustic wave propagation direction with respect to the crystal X axis becomes about 90°, and then, the mother wafer is cut at predetermined positions to be divided into individual surface acoustic wave elements.

In the surface acoustic wave device 1 shown in FIG. 1, which is produced by the above-described method, the IDT electrode 3 and the reflectors 4 and 5 have the above-described multi-layer structure. Therefore, frequency dispersion, which may be caused by dispersion in the film thickness of the electrode films constituting the IDT electrode 3 and the reflectors 4 and 5, is minimized. Thus, surface acoustic wave devices having characteristics with lower dispersion can be efficiently provided.

Figure 3:
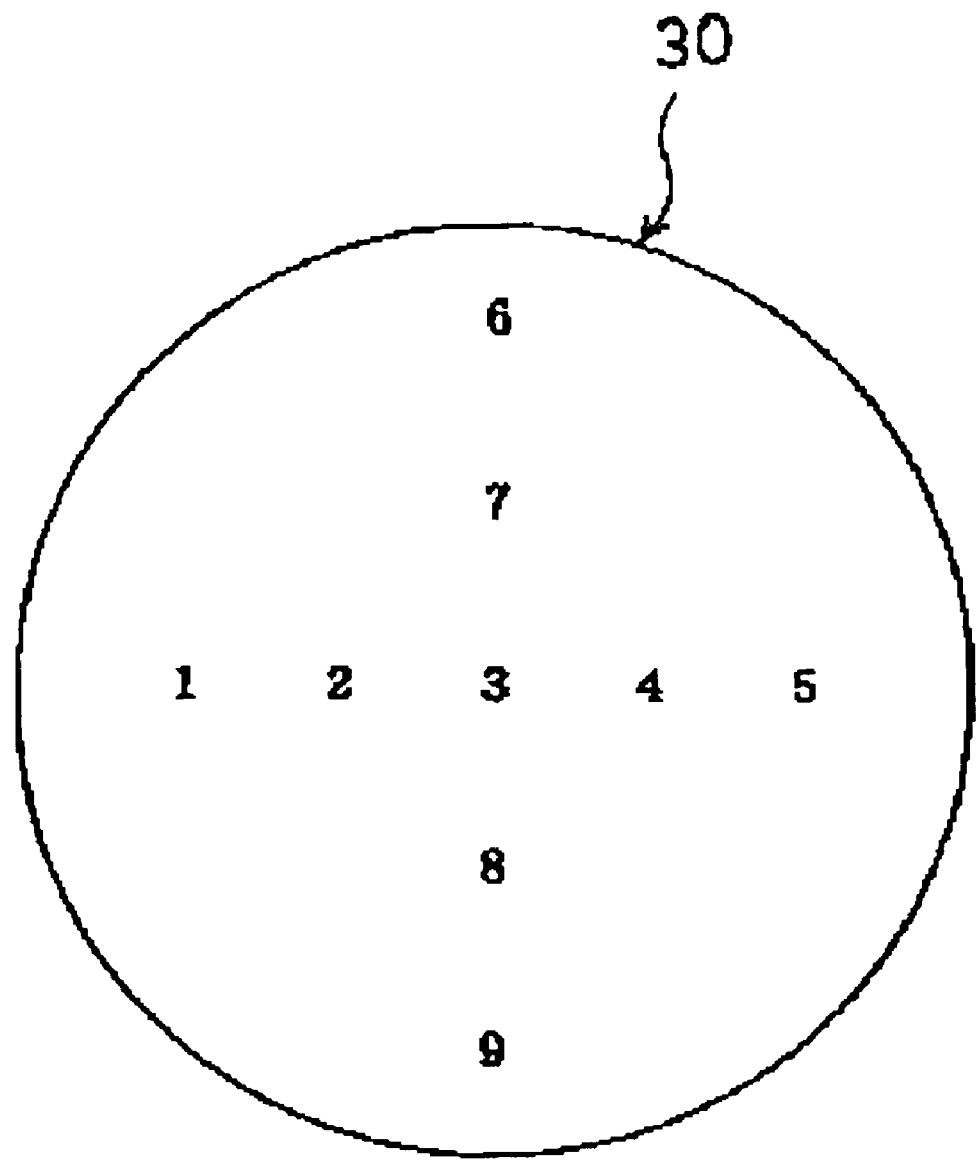
FIG. 3 illustrates the positions (measurement points) of multiple filters disposed in a wafer, the characteristics of which were measured.

Evaluation of Characteristics:

A wafer (mother wafer) 30 shown in FIG. 3 was prepared. A plurality of filters (the filters of preferred embodiments of the present invention) including the IDT electrode 3 and the reflectors 4 and 5 having the multi-layer structure shown in FIGS. 1 and 2 were produced. Of the many filters formed on the wafer (mother wafer) 30, the insertion loss and the center frequency were measured for the filters located at the positions designated by numbers 1 to 9 in FIG. 3. The results are shown in Table 1. The target center frequency of each filter is 200 MHz.

TABLE 1

| Measurement point | Filter of comparative example | | Filter of Preferred Embodiments | |
|---|---|---|---|---|
| | Insertion loss (dB) | Center Frequency (MHz) | Insertion loss (dB) | Center frequency (MHz) |
| 1 | −3.51 | 200.74 | −3.03 | 200.22 |
| 2 | −3.61 | 200.49 | −3.11 | 200.15 |
| 3 | −3.48 | 199.63 | −3.09 | 200.01 |

TABLE 1-continued

| | Filter of comparative example | | Filter of Preferred Embodiments | |
|---|---|---|---|---|
| Measurement point | Insertion loss (dB) | Center Frequency (MHz) | Insertion loss (dB) | Center frequency (MHz) |
| 4 | −3.55 | 200.01 | −3.08 | 200.08 |
| 5 | −3.34 | 200.64 | −3.12 | 200.17 |
| 6 | −3.41 | 200.79 | −3.05 | 200.25 |
| 7 | −3.72 | 200.48 | −3.00 | 200.04 |
| 8 | −3.82 | 199.81 | −3.29 | 200.18 |
| 9 | −3.54 | 200.93 | −3.25 | 200.27 |
| Total evaluation | MAX −3.82 MIN −3.41 AVE −3.55 | 3σ 0.4627 | MAX −3.29 MIN −3.00 AVE −3.11 | 3σ 0.0916 |

Moreover, for comparison, a plurality of filters (filters as comparative examples) were produced and had an IDT electrode and reflectors that were formed by forming a Ti film and an Au film as electrode films in that order on a wafer (original substrate) by use of the same film-forming apparatus as in the above-described example. Similarly to the filters of the above-described examples, the insertion losses and the center frequencies of the filters located at the positions indicated by the numbers 1 to 9 in FIG. 3 were measured. The results are also shown in Table 1. The target center frequency of the filters as the comparative examples was approximately 200 MHz.

As seen in Table 1, the filters of the preferred embodiment having the multi-layer structure exhibited much less dispersion in the center frequency and a small insertion loss compared to the filters of the comparative examples.

The filters of the present preferred embodiment of the comparative examples were formed by use of the same film-forming apparatus, and the film-thickness distributions were substantially the same as described above. However, for the filters of the present preferred embodiment, the frequency dispersion was greatly improved, and the insertion losses were significantly reduced. Therefore, it can be understood that the improvement of the characteristics is attributed to the operation and effects of the electrode structure of various preferred embodiments of the present invention.

Accordingly, in the case in which the in-plane film-thickness distribution for a film-forming apparatus is sufficiently narrow, frequency adjustment is rendered unnecessary, and the manufacturing cost is greatly reduced due to the enhancement of production throughput by adopting the multi-layer film structure of preferred embodiments of the present invention for the IDT electrode and the reflectors. Furthermore, damage to the IDT electrode and the reflectors is prevented and accordingly, a high manufacturing yield is realized.

Moreover, a vibration mode that exerts an undesired influence over the characteristics is reliably minimized in the film-thickness range in which a high vibration damping efficiency and an excellent reflection efficiency. Thus, excellent characteristics are obtained.

If it is desired to further decrease the dispersion in the center frequency, such a decrease can be realized by increasing the ratios of metals such as Ni, Al, and other suitable materials having a low specific gravity and a high acoustic velocity (that is, the number of low specific gravity metal component containing layers is increased, or the film-thickness is increased), in the range thereof where excellent resonator and filter characteristics can be obtained.

In other respects, the present invention is not restricted to the above-described preferred embodiment. Various applications and modifications may be made without departing from the scope of the present invention with respect to materials for forming the piezoelectric substrate and special shapes and sizes thereof, special compositions and film-thicknesses of the high specific gravity metal component containing layer and the low specific gravity metal component containing layers, and combinations of the high specific gravity metal component containing layer and the low specific gravity metal component containing layers.

As described above, the surface acoustic wave device of the present invention includes an interdigital transducer (IDT) electrode and an optional reflector disposed on a piezoelectric substrate, each of the IDT electrode and the optional reflector having a multi-layer film structure including at least one layer including as a major component a metal with a specific gravity of at least about 15 and having a film-thickness of at least about 10 nm (high specific gravity metal component containing layer), and at least one layer containing including as a major component a metal with a specific gravity of up to about 10 and a bulk resistivity (at 20° C.) of up to about $10\times10^{-8}$ Ω·m, and having a film-thickness of at least about 10 nm (low specific gravity metal component containing layer). That is, the multi-layer structure is constructed by combining the high specific gravity metal component containing layer which has a high density, and is highly effective in reducing the propagation velocity of a surface acoustic wave on the piezoelectric substrate, with the low specific gravity metal component containing layer which has a low density, and is less effective in reducing the propagation velocity of the surface acoustic wave on the piezoelectric substrate. Thus, excellent resonator and filter characteristics can be ensured, and moreover, dispersion in the center frequency of a plurality of resonators and filters produced in the same wafer is minimized.

Accordingly, it becomes unnecessary to perform frequency adjustment for individual surface acoustic wave devices which has been conventionally required. The manufacturing throughput is also greatly increased, and the manufacturing cost is greatly reduced.

Moreover, deterioration in the characteristics, caused by damage or adhesion of foreign matter when the frequency adjustment is carried out, is eliminated. Thus, the yield is greatly enhanced. A vibration mode which exerts an undesired influence over the characteristics is minimized in the film-thickness range where excellent excitation and reflection efficiencies are reliably ensured. Thus, excellent characteristics are achieved.

Moreover, a vibration mode which has undesired effects on the characteristics at the film-thickness at which high excitation and reflection efficiencies are provided is minimized-by-changing the structure of the IDT electrode and the reflectors. Thus, a characteristic that is more desirable than that of an ordinary single layer film is achieved.

Preferably, the total number of layers of the at least one high specific gravity metal component containing layer and the at least one low specific gravity metal component containing layer which constitute the IDT electrode and the reflector is preferably in the range of from about 2 to about 10. Thereby, a surface acoustic wave device which has excellent resonator and filter characteristics and which minimizes frequency dispersion, that may be caused by dispersion in the film thickness, is provided without an excessively complicated lamination process. Thus, the present invention is easy to manufacture and can be efficiently produced.

Preferably, the metal having a specific gravity of at least about 15 which constitutes the high specific gravity metal component containing layer is preferably selected from the group consisting of Au, W, Ta, Pt, and alloys containing at least one of the metals, and the metal having a specific gravity of up to about 10 and a bulk resistivity (at 20° C.) of up to about $10 \times 10^{-8}$ Ω·m which constitutes the low specific gravity metal component containing layer is preferably selected from the group consisting of Ni, Cu, Al, Mg, Co, Fe, Zn, and alloys containing at least one of those metals. Thereby, a surface acoustic wave device having excellent resonator and filter characteristics and that minimizes frequency dispersion is provided.

Moreover, when the present invention is applied to a surface acoustic wave device utilizing excitation of an SH wave, a surface acoustic wave device, in which the SH wave can be excited and reflected efficiently and easily and which has excellent resonator and filter characteristics and low frequency dispersion is provided.

When the volume of the low specific gravity metal component containing layer is in the range of about 25% to about 98% of the overall volume of the IDT electrode or the reflector containing the low specific gravity metal component containing layer, excellent resonator and filter characteristics can be ensured, and moreover, frequency dispersion is minimized. In addition, the frequency adjustment of the individual surface acoustic wave devices becomes unnecessary, and the cost can be reduced due to the increased throughput. Furthermore, the yield is greatly increased while damage to the substrate, the IDT electrode, and the reflector is prevented.

The volume of the low specific gravity metal component containing layer that constitutes the IDT electrode or the reflector may be in the range of about 60% to about 98% of the overall volume of the IDT electrode or the reflector containing the low specific gravity metal component containing layer. In this case, even more desirable resonator and filter characteristics can be ensured, and also, frequency dispersion is minimized.

Preferably, in the IDT electrode or the reflector, the low specific gravity metal component containing layer is disposed nearer to the piezoelectric substrate than the at least one high specific gravity metal component containing layer. In this case, the effects of the reflector on reflection of a surface acoustic wave and also, the effects on suppression of the frequency dispersion are achieved.

When the high specific gravity metal component containing layer is arranged to define the outermost surface layer of the IDT electrode or the reflector, the frequency-adjustment, if required, can be efficiently performed by irradiating ion beams at a low dose. Thus, deterioration of the characteristics is prevented.

When the low specific gravity metal component containing layer includes Ni as a major component, and the high specific gravity metal component containing layer includes Au as a major component, the effects of Ni on reduction in influence caused by dispersions in film-thickness and also, the effects of Au on high reflection of a surface acoustic wave are achieved.

When the low specific gravity metal component containing layer includes Cu as a major component, the resistivity of the film is greatly reduced. Thus, excellent filter and resonator characteristics are obtained.

Preferably, the IDT electrode or the reflector includes the high specific metal component containing layer including Au as a major component, the low specific gravity metal component containing layer including Cu as a major component, and the low specific gravity metal component containing layer including Ni as a major component, and the volume of the high specific metal component containing layer including Au as a major component is in the range of about 2% to about 30% of the overall volume of the IDT electrode or the reflector, the volume of the low specific metal component containing layer including Cu as a major component is in the range of about 10% to about 60% of the overall volume of the IDT electrode or the reflector, and the volume of the low specific metal component containing layer including Ni as a major component is in the range of about 15% to about 78% of the total volume of the IDT electrode or the reflector. In this case, undesirable waves, which may be generated when the device is used as a resonator or a filter, are eliminated and excellent characteristics are achieved.

Preferably, in the IDT electrode or the reflector, the low specific metal component containing layer including Cu as a major component is disposed between the high specific metal component containing layer including Au as a major component and the piezoelectric substrate, and the low specific metal component containing layer including Ni as a major component is disposed between the low specific metal component containing layer including Cu as a major component and the piezoelectric substrate. In this case, the effects on suppression of an undesired wave and also, the effects on reduction in resonance resistance are achieved.

According to another preferred embodiment of the present invention, a method of producing a surface acoustic wave device preferably includes the steps of forming a plurality of IDT electrodes or a plurality of IDT electrodes and reflectors on a mother wafer of the piezoelectric substrate, the piezoelectric being made of a rotated Y-cut quartz substrate having Euler's angles expressed as (0, θ, φ) in which θ is in the approximate range of 125°<θ<132° or is equivalent to the range in such a manner that the angle φ of the surface acoustic wave propagation direction to the crystal X axis is about 90°, and cutting the mother wafer at predetermined positions to divide it into individual surface acoustic wave elements. Accordingly, frequency dispersion is minimized. Thus, surface acoustic wave devices having much lower dispersion of the characteristics are efficiently produced. Moreover, since frequency adjustment for each of the surface acoustic wave devices becomes unnecessary, the manufacturing cost is greatly reduced due to the increased throughput. Moreover, a high yield can be achieved while damage to the substrate, the IDT electrode, and the reflector is prevented.

Preferably, the surface acoustic wave device of various preferred embodiments of the present invention preferably is formed by cutting the original substrate for the piezoelectric substrate, which has the plurality of IDT electrodes or the plurality of IDT electrodes and the plurality of reflectors. The IDT electrodes and the reflectors have a multi-layer structure. The frequency dispersion is minimized and frequency adjustment for each of the surface acoustic wave elements is not required. Thus, a surface acoustic wave device that has excellent resonator and filter characteristics and also, minimal dispersion of the characteristics is achieved at low cost.

While the present invention has been particularly shown and described with reference to preferred embodiments thereof, it will be understood by those skilled in the art that the foregoing and other changes in form and details can be made without departing from the spirit and scope of the present invention.

What is claimed is:

1. A method of producing a surface acoustic wave device, comprising the steps of:

forming at least one of a plurality of interdigital transducer electrodes on a mother wafer including a piezoelectric substrate, wherein the plurality of interdigital transducer electrodes are formed to have a multi-layer structure including:
(a) at least one high specific gravity metal component containing layer having a film-thickness of at least about 10 nm and including as a major component a metal having a specific gravity of at least about 15; and
(b) at least one low specific gravity metal component containing layer having a film-thickness of at least about 10 nm and including as a major component a metal having a specific gravity of up to about 10 and a bulk resistivity, at 20° C., of up to about $10 \times 10^{-8}$ $\Omega \cdot m$; and cutting the mother wafer at predetermined positions to divide the mother wafer into individual surface acoustic wave elements.

2. The method according to claim 1, further comprising the step of forming a plurality of reflectors on the mother wafer such that the plurality of reflectors have said multi-layer structure.

3. The method according to claim 1, wherein the piezoelectric substrate is formed of a rotated Y-cut quartz substrate having Euler's angles expressed as $(0, \theta, \phi)$ in which $\theta$ is in the range of $125° < \theta < 132°$ or is equivalent to the range in such a manner that the angle $\phi$ of the surface acoustic wave propagation direction with respect to the crystal X axis is about 90°.

* * * * *